United States Patent [19]

Snedkerud et al.

[11] 4,209,758
[45] Jun. 24, 1980

[54] METHOD AND APPARATUS FOR THE AUTOMATIC MATCHING OF A TRANSMITTER TO AN ANTENNA

[75] Inventors: Ole Snedkerud, Windisch; Jurg Wyss, Dottingen, both of Switzerland

[73] Assignee: Patelhold Patentverwertungs- & Elektro-Holding AG., Glarus, Switzerland

[21] Appl. No.: 916,539

[22] Filed: Jun. 19, 1978

[30] Foreign Application Priority Data

Jun. 22, 1977 [CH] Switzerland ........................ 7643/77

[51] Int. Cl.$^2$ ............................................. H03H 7/40
[52] U.S. Cl. .................................. 333/17 M; 455/129
[58] Field of Search .............. 333/17 M; 325/171–177

[56] References Cited

U.S. PATENT DOCUMENTS

| | | | |
|---|---|---|---|
| 3,355,667 | 11/1967 | Bruene | 333/17 M X |
| 3,443,231 | 5/1969 | Roza | 333/17 M X |

*Primary Examiner*—Paul L. Gensler
*Attorney, Agent, or Firm*—Orville N. Greene; Frank L. Durr

[57] ABSTRACT

A method and apparatus for the automatic matching of a transmitter to an antenna is disclosed. A voltage signal proportional to the square root of the load impedance of the final stage of the transmitter is compared to a signal which is proportional to the square root of the nominal value of the final stage load impedance and the difference is used as the criteria for tuning a load coupling coil connecting the final stage of the transmitter to the antenna.

2 Claims, 1 Drawing Figure

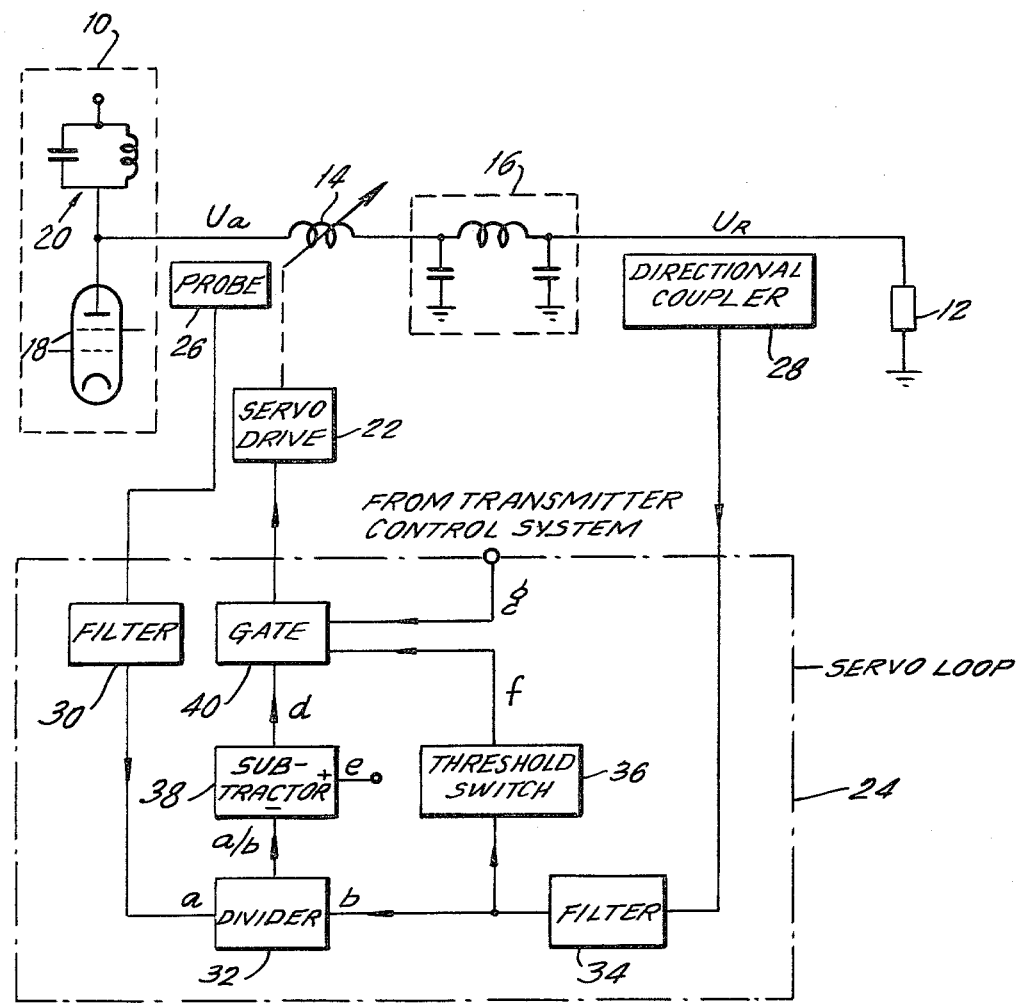

METHOD AND APPARATUS FOR THE AUTOMATIC MATCHING OF A TRANSMITTER TO AN ANTENNA

BACKGROUND OF THE INVENTION

The present invention relates to a method for automatically matching the impedance of the final stage of a transmitter with the impedance of an antenna by means of a servo loop. More particularly, the present invention is directed towards a method wherein a control signal is obtained by a comparison of electrical signals, and a control signal is used to control a motor-driven matching element via a servo amplifier in such a way that the control signal is brought to zero by means of a proper input.

In known methods of this kind, a voltage proportional to the anode d.c. current, and the anode a.c. voltage of the final stage tube of a transmitter, have been used as the tuning criterion for a load matching of the final stage of the transmitter. In one known method, these two voltages are compared with each other in a comparator. In a second known method, a voltage proportional to the antenna load impedance, obtained with a directional coupler, is compared in a comparator with the anode a.c. voltage of the final stage of the transmitter, and the difference is used as a criterion for the tuning by means of a servo loop.

It has been found in practice that, in the first of these prior art methods, the servo loop becomes unstable under certain conditions, because the degree of efficiency of the final stage of the transmitter changes with tuning. The second method is better in this respect, but like the first method, it has the disadvantage that at low anode voltages (the automatic tuning phase begins at zero), the sensitivity of the servo loop is correspondingly reduced. As a result, the system inputs more slowly, and any noise components present exert a stronger effect and can lead to input difficulties.

BRIEF DESCRIPTION OF THE INVENTION

The present invention overcomes the foregoing disadvantages of the known methods. This is achieved by having the a.c. anode voltage of the transmitter output tube detected by a probe, rectified, and the modulation component of the output signal generated by the transmitter eliminated by means of a low-pass filter; a d.c. voltage proportional to the square root of the output impedance is obtained by means of a directional coupler and is freed of the modulation component with a second low-pass filter; the output signal of the first filter is sent to a divider as a dividend, and the output signal of the second filter is sent to the divider as the divisor; the output of the divider, which is proportional to the square root of the anode load impedance, is subtracted from a reference voltage which is proportional to the square root $$\sqrt{R_{a\ nom}} \approx \sqrt{R_a}\left(1 \pm \frac{\Delta R_a}{2R_a}\right)$$

of the nominal value of the anode load impedance; the output signal of the comparator is sent via a gate switch to a servo drive; and if the output power is too small, the gate switch is blocked by a threshold value switch, while if the anode voltage is too small, the gate switch is blocked by a second signal from the transmitter control system.

BRIEF DESCRIPTION OF THE DRAWINGS

For the purpose of illustrating the invention, there is shown in the drawings a form which is presently preferred, it being understood, however, that this invention is not limited to the precise arrangements and instrumentalities shown.

The single FIGURE is a schematic diagram of the automatic impedance matching system of the present invention.

DETAILED DESCRIPTION OF THE PREFERRED EMBODIMENT

For a correct load matching, it is necessary to know the instantaneous value of the anode load impedance $R_a$. The anode impedance $R_a$ is related to the anode load voltage $U_a$ as follows:

$$P_o = U_a^2/R_a \tag{1}$$

wherein $P_o$ is the output power. Solving for the anode load impedance $R_a$ we get:

$$R_a = U_a^2/P_o \tag{2}$$

The output power $P_o$ may be determined by taking the square of the output voltage $U_R$ across the antenna and multiplying this by a factor $K^2$:

$$P_o = K^2 \cdot U_R^2 \tag{3}$$

The squared factors in both equations (2) and (3) can be eliminated by combining the equations and solving for the value:

$$\sqrt{R_a} = U_a\sqrt{P_o} = U_a/(K \cdot U_R) \tag{4}$$

As a result of the foregoing, it is not necessary to perform two squaring operations and the required electronics are smaller, simpler and cheaper. Calculations can be done just as well with the square root of a quantity as with the quantity itself.

The anode impedance $R_a$—or, in the simplified case $\sqrt{R_a}$—is compared to a nominal value of the anode impedance $\sqrt{R_{a\ nom}}$ by means of a difference comparator, wherein:

$$\sqrt{R_{a\ nom}} = \sqrt{R_a \pm \Delta R_a} = \sqrt{R_a}\sqrt{1 \pm \frac{\Delta R_a}{R_a}} \approx \sqrt{R_a}\left(1 \pm \frac{\Delta R_a}{2R_a}\right). \tag{5}$$

for $\Delta R_a << R_a$. We further obtained, by subtraction, the measurable quantity:

$$\Delta R = \sqrt{R_{a\ nom}} - \sqrt{R_a} = \pm(\Delta R_a/2\sqrt{R_a}) \tag{6}$$

As a result of the square root formation, the sensitivity of the system has decreased by a factor $2\sqrt{R_a}$. But since $\Delta R_a << R_a$, the factor remains almost constant, and an appropriate increase in the amplification of the servo loop can fully restore the required sensitivity; hence $$\Delta R' = \pm \Delta R_a \tag{7}$$

If there is a greater change in $R_a$, the amplification of the servo loop is increased with decrease in $R_a$, and this amplification is correspondingly reduced if $R_a$ increases, but always proportionally to $\sqrt{R_a}$. Therefore an instability can arise only in the case of a substantial decrease in $R_a$. But as has been found in practice, the stability limits are large enough so that no instabilities are to be expected in connection with the overall concept chosen. In comparison with the more primitive prior art difference system, appreciable gains in stability can be shown.

Referring now to the drawing, one practical embodiment of the present invention is illustrated. As shown therein, an output section 10 of the transmitter is coupled to an antenna 12 via a load coupling coil 14 and a high-wave filter 16. The final stage 10 of the transitter includes a final stage tube 18 and a final stage oscillator circuit 20. The impedance of the final stage 10, will vary as the function of the frequency of the signal output of the transmitter. The nominal anode impedance of the tube 18 is that impedance of the output stage 10 for the average frequency output of the transmitter.

The impedance of load coupling coil 14 is adjusted by the servo drive 22 to insure the desired impedance matching between the output of the final stage 10 and the antenna load 12. This value will be initially set to insure proper impedance matching when the output stage 10 exhibits its nominal impedance $R_{a\ nom}$. When the instantaneous anode load impedance $R_a$ varies, this variation will be detected by servo loop 24 which will generate an output signal which is applied to servo drive 22 and which causes servo drive 22 to adjust the impedance of load coupling coil 14 so as to offset any variations in the instantaneous anode load impedance $R_a$ from the nominal value $R_{a\ nom}$.

Servo loop 24 receives a first input signal from probe 26 and a second input signal from directional coupler 28. Probe 26 detects and rectifies the a.c. anode voltage $U_a$ and applies it to low-pass filter 30. Low-pass filter 30 frees the d.c. signal generated by probe 26 of the modulation component of the output of the transmitter and applies it to a first input of divider 32.

Directional coupler 28 detects the output voltage $U_R$ across the antenna 12 and applies a d.c. voltage, proportional to the square root of the output power, to low-pass filter 34. Low-pass filter 34 removes the modulation component from the d.c. signal generated by directional coupler 28 and applies it to a second input of divider 32 and to threshold switch 36. Divider 32 forms the quotient a/b and applies it to the subtracting input of subtractor (e.g., difference comparator) 38. The adding input of subtractor 38 receives a reference signal e which is representative of the square root of nominal value of the anode load impedance. The difference, d, is applied to a gate circuit 40 which receives a first input (f) from threshold switch 36 and a second input (g) from the transmitter control system. The signal f from threshold switch 36 blocks gate 40 if the output powers is too small. The signal g from the transmitter control system (not shown) blocks gate 40 if the anode voltage is too small. When gate 40 is open, the servo loop adjusts itself in such a way that the difference signal d disappears.

The present invention may be embodied in other specific forms without departing from the spirit or essential attributes thereof and, accordingly, reference should be made to the appended claims, rather than to the foregoing specification as indicating the scope of the invention.

What is claimed is:

1. A method for automatically matching the final stage of a transmitter to an antenna comprising the steps of:
    detecting the anode a.c. voltage of a final stage tube of said final stage of said transmitter, rectifying said anode a.c. voltage and filtering out a modulation component from said rectified anode a.c. voltage;
    generating a d.c. voltage which is proportional to the square root of the output power to said antenna and thereafter filtering out the modulation component from said d.c. voltage;
    dividing said filtered, rectified, anode a.c. voltage by said filtered d.c. voltage so as to form a quotient signal which is proportional to the square root of the impedance of said final stage of said transmitter;
    subtracting said quotient signal from a reference signal characterizing the square root of the nominal value of said final stage impedance so as to generate a difference signal; and
    varying the value of a load coupling coil coupling said final stage to said antenna as a function of said difference signal when the power applied to said antenna is greater than a first predetermined minimum value and said anode voltage is greater than a second predetermined minimum value.

2. An apparatus for automatically matching the final stage of the transmitter to an antenna comprising:
    a load coupling coil coupling said final stage to said antenna;
    probe means for detecting and rectifying an anode a.c. voltage of a final stage tube of said final stage of said transmitter;
    a first low-pass filter for removing a modulation component from said detected, rectified anode a.c. voltage;
    directional coupling means for generating a d.c. voltage which is proportional to the square root of the output power to said antenna;
    second low-pass filter means for filtering said d.c. voltage;
    means for dividing the output of said first low-pass filter by the output of said second low-pass filter so as to form a quotient signal which is proportional to the square root of the impedance of said final stage of said transmitter;
    means for subtracting said quotient signal from a reference signal characterizing the square root of the nominal value of said final stage impedance so as to generate a difference signal; and
    means for varying the value of said load coupling coil as a function of said difference signal when the power applied to said antenna is greater than a first predetermined minimum value and said anode voltage is greater than a second predetermined minimum value.

* * * * *